(12) United States Patent
Chang et al.

(10) Patent No.: US 10,147,728 B1
(45) Date of Patent: Dec. 4, 2018

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/678,084

(22) Filed: Aug. 15, 2017

(30) Foreign Application Priority Data

Jul. 18, 2017 (CN) .......................... 2017 1 0585086

(51) Int. Cl.
| | | |
|---|---|---|
| H01L 21/00 | (2006.01) | |
| H01L 27/108 | (2006.01) | |
| H01L 29/06 | (2006.01) | |
| H01L 21/762 | (2006.01) | |

(52) U.S. Cl.
CPC .. *H01L 27/10876* (2013.01); *H01L 21/76224* (2013.01); *H01L 27/10823* (2013.01); *H01L 29/0649* (2013.01)

(58) Field of Classification Search
CPC ....... H01L 21/76224; H01L 21/823481; H01L 29/0649
See application file for complete search history.

(56) References Cited

U.S. PATENT DOCUMENTS

| | | | |
|---|---|---|---|
| 9,953,982 B1* | 4/2018 | Chen ................ | H01L 27/10823 |
| 2007/0120185 A1* | 5/2007 | Komukai ........ | H01L 21/823814 |
| | | | 257/339 |
| 2015/0035022 A1* | 2/2015 | Chung ............. | H01L 21/76224 |
| | | | 257/288 |

OTHER PUBLICATIONS

Feng-Yi, Chang, Title of Invention: Semiconductor Device and Method for Fabricating the Same, U.S. Appl. No. 15/611,759, filed Jun. 1, 2017.

\* cited by examiner

*Primary Examiner* — Nicholas J Tobergte
(74) *Attorney, Agent, or Firm* — Winston Hsu

(57) ABSTRACT

A method for fabricating semiconductor device includes the steps of: forming a first trench in a substrate; forming a first shallow trench isolation (STI) in the first trench; forming a first patterned mask on the substrate; and using the first patterned mask to remove part of the first STI for forming a second trench and remove part of the substrate for forming a third trench. Preferably, a bottom surface of the third trench is lower than a bottom surface of the second trench.

14 Claims, 5 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: forming a first trench in a substrate; forming a first shallow trench isolation (STI) in the first trench; forming a first patterned mask on the substrate; and using the first patterned mask to remove part of the first STI for forming a second trench and remove part of the substrate for forming a third trench. Preferably, a bottom surface of the third trench is lower than a bottom surface of the second trench.

According to another aspect of the present invention, a semiconductor device includes: a first gate structure in a substrate; a second gate structure in the substrate and adjacent to the first gate structure; and a first shallow trench isolation (STI) under the first gate structure. Preferably, a top surface of the first STI is higher than a bottom surface of the second gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
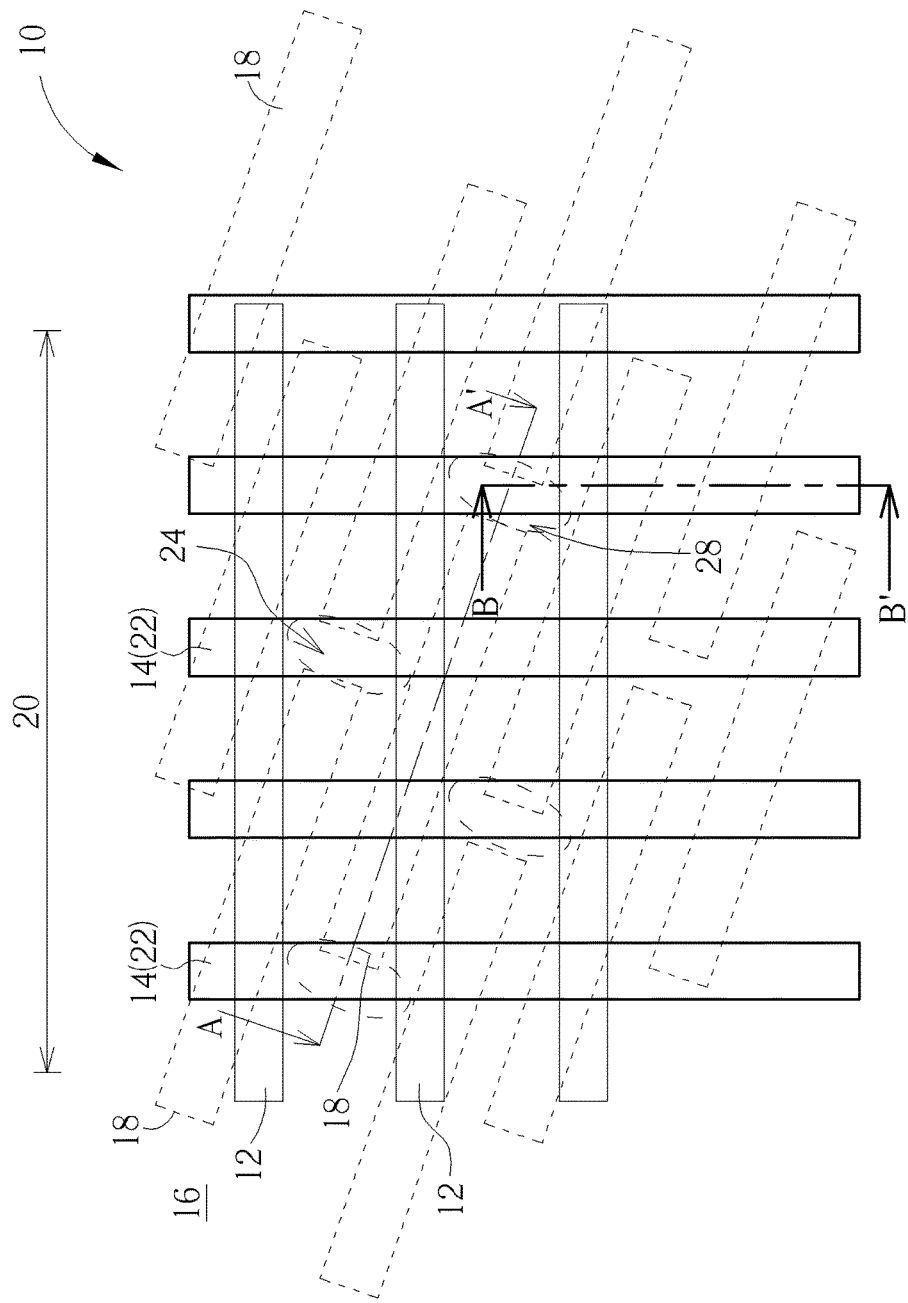
FIGS. 1-9 illustrate a method for fabricating a DRAM device according to an embodiment of the present invention.
Figure 2:
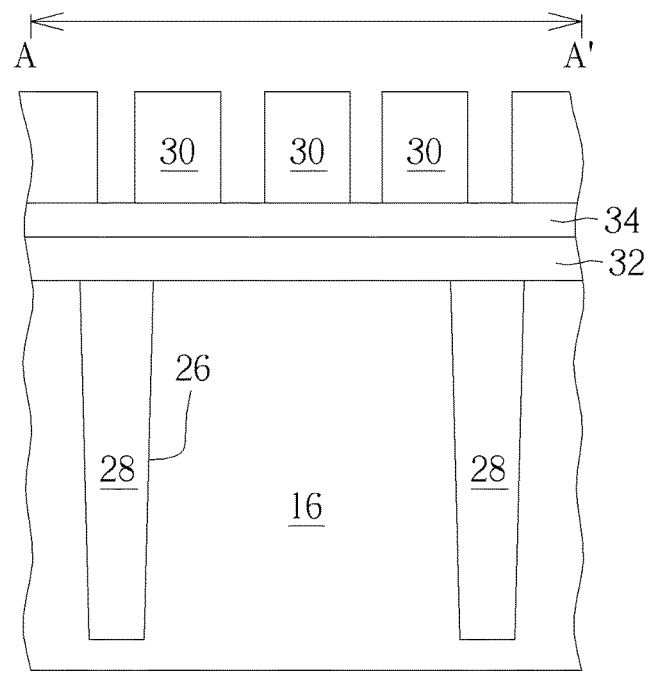

Referring to FIGS. 1-9, FIGS. 1-9 illustrate a method for fabricating a DRAM device according to an embodiment of the present invention, in which FIG. 1 illustrates a top-view diagram, FIG. 2 is a cross-sectional view illustrating a method for fabricating a DRAM device along the sectional line AA' of FIG. 1, the left portions of FIGS. 3-9 are cross-sectional views illustrating the process conducted after FIG. 2 along the sectional line AA' of FIG. 1, and the right portions of FIGS. 3-9 are cross-sectional views illustrating the process conducted after FIG. 2 along the sectional line BB' of FIG. 1. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STIs 24. Preferably, the gates 22 are disposed extending along a second direction, in which the second direction crosses the first direction at an angle less than 90 degrees.

The bit lines 12 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

The fabrication of word lines 14 (or also referred to as buried word lines) is explained below. As shown in FIG. 2, a first trench 26 is formed in the substrate 16, a first STI 28 is formed in the first trench 26, and a first patterned mask 30 is formed on the substrate 16. In this embodiment, a dielectric layer 32 made of silicon oxide and an amorphous carbon film (APF) 34 could be formed on the substrate 16 and the first STI 28 before forming the first patterned mask 30, and the patterned mask 30 is formed on the APF 34 thereafter. Preferably, the first STI 28 is made of a single material such as silicon oxide, but not limited thereto.

Figure 3:
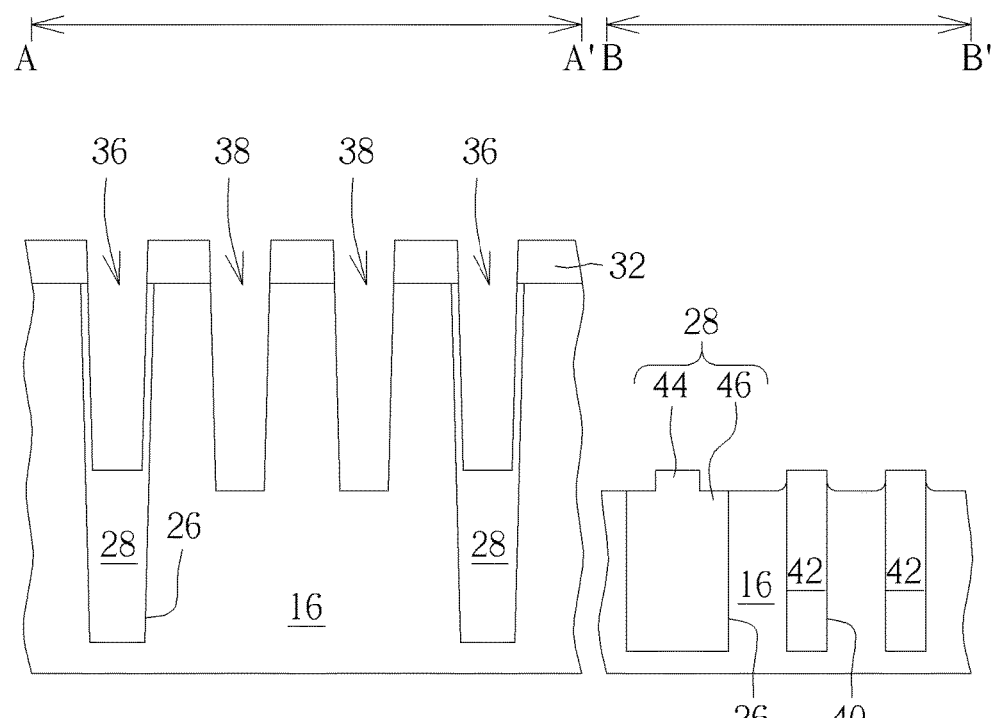

Next, as shown in FIG. 3, an etching process is conducted by using the patterned mask 30 as mask to remove part of the first STI 28 to form second trenches 36 and at the same time forming third trenches 38 in the substrate 16, in which a bottom surface of the third trench 38 is slightly lower than a bottom surface of the second trench 36. Next, the first patterned mask 30 and the remaining APF 34 are removed and part of the dielectric layer 32 is remained on the substrate 16.

In this embodiment, the etching gases used to form the second trenches 36 and the third trenches 38 are selected from the group consisting of $Cl_2$, $CF_4$, and $CH_xF_y$, in which the etching target of $Cl_2$ preferably being the substrate 16 made of silicon, the etching target of $CF_4$ preferably being both the substrate 16 and the first STI 28 made of silicon oxide, and the etching target of $CH_xF_y$ preferably being the first STI 28. Preferably, the present invention adjusts the selectivity between silicon and silicon oxide by removing more substrate 16 during the removal of the first STI 28 and substrate 16 so that the bottom of the third trenches 38 would be slightly lower than the bottom of the second trenches 36.

It should be noted that the substrate 16 shown along the sectional line BB' in FIG. 3 also includes at least a fourth trench 40 adjacent to the first trench 26 and at least a second STI 42 disposed in the fourth trench 40. Preferably, the fourth trench 40 and the first trenches 26 are preferably formed at the same time in the substrate 16, the second STI 42 and the first STI 28 are formed at the same in the fourth trench 40 and the first trench 26, and the top surface of the first STI 28 is even with the top surface of the second STI 42.

In this embodiment, the first STI 28 shown on the right portion of FIG. 3 further includes a top portion 44 and a bottom portion 46, in which the width of the top portion 44 is less than the width of the bottom portion 46. Moreover, the top surface of the top portion 44 is preferably higher than the top surface of the substrate 16 and even with the top surface of the second STI 42 while the top surface of the bottom portion 46 is even with the top surface of the substrate 16.

Figure 4:
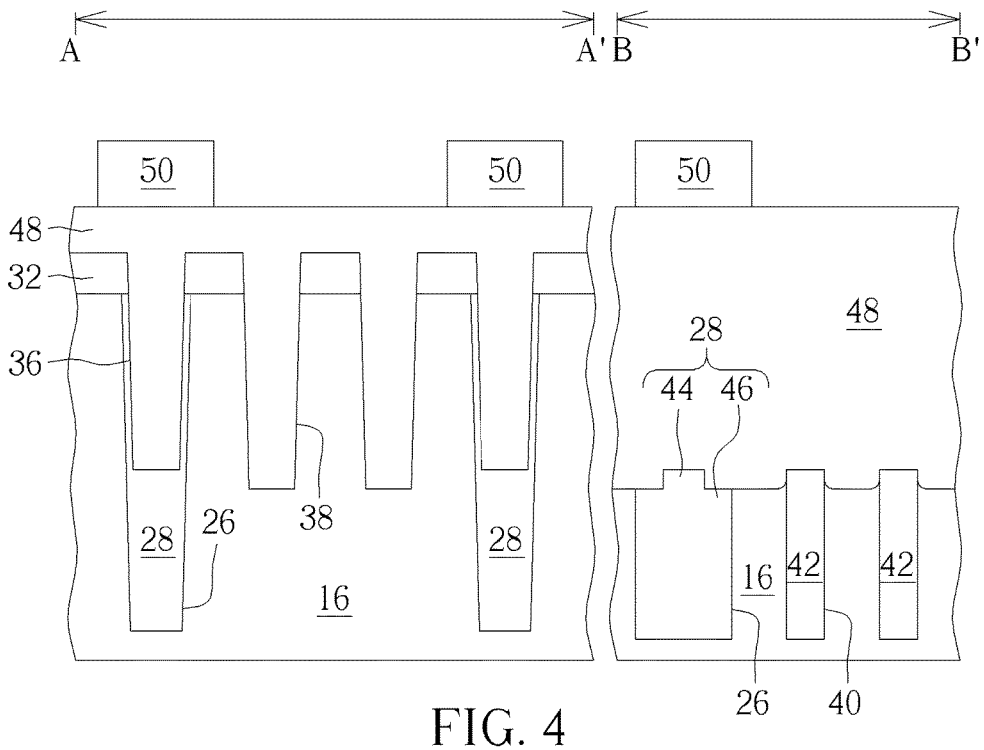

Next, as shown in FIG. 4, a second patterned mask (not shown) is formed on the first STI 28 after the second trenches 36 and third trenches 38 are formed. In this embodiment, the formation of the second patterned mask is accomplished by first forming an organic layer 48 to fill the second trenches 36 and the third trenches 38 and then forming a patterned resist 50 on the organic layer 48.

Figure 5:
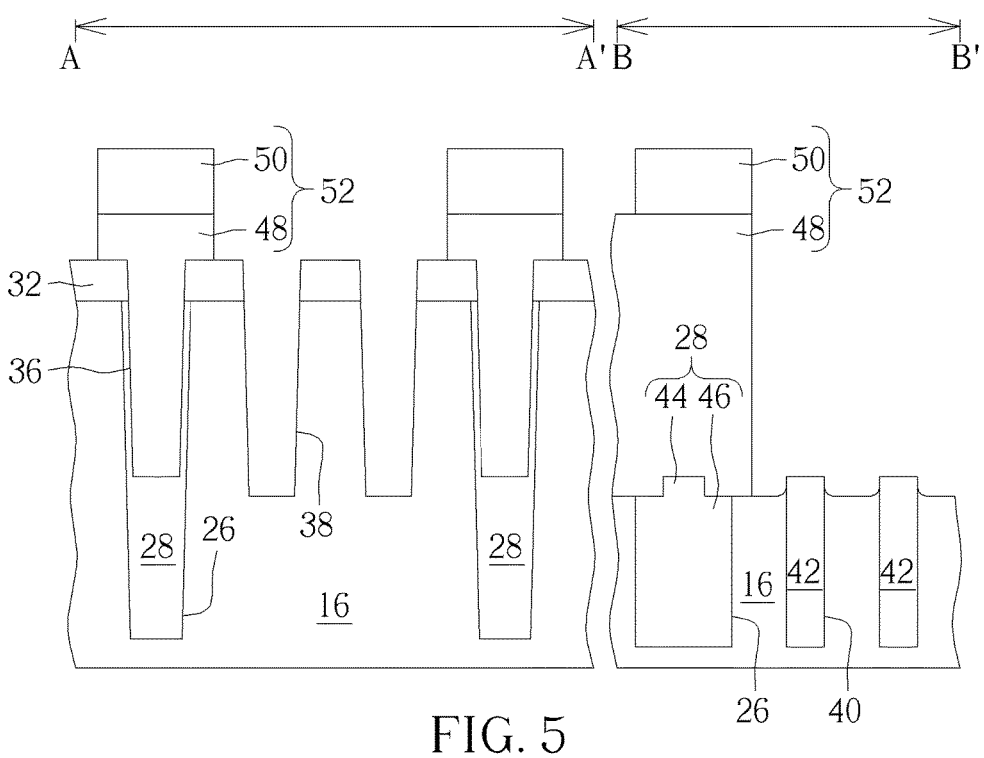

Next, as shown in FIG. 5, an etching process is conducted by using the patterned resist 50 as mask to remove part of the organic layer 48 to form a patterned organic layer 48, in which the patterned organic layer 48 and the patterned resist 50 together constitute the aforementioned second patterned mask 52 and the second patterned mask 52 preferably includes an opening exposing the third trenches 38 and the second STI 42.

Figure 6:
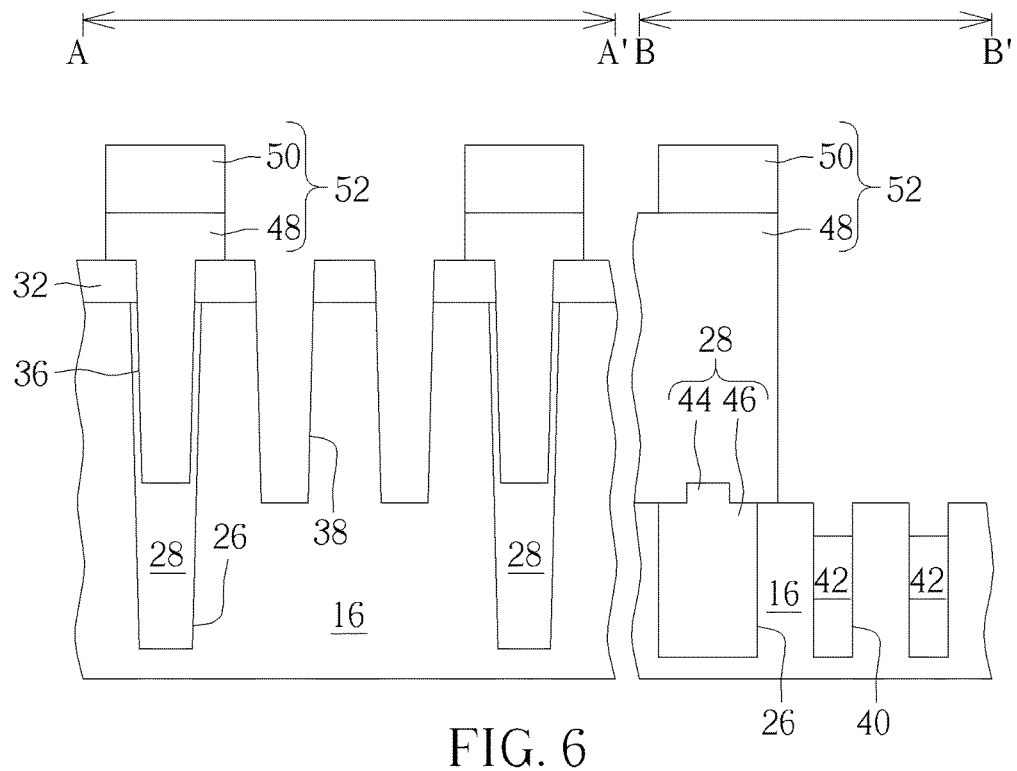

Next, as shown in FIG. 6, an etching process is conducted by using the second patterned mask 52 as mask to remove part of the second STI 42 on the right portion of FIG. 6 so that the top surface of the second STI 42 now becomes slightly lower than the top surface of the first STI 28.

Figure 7:
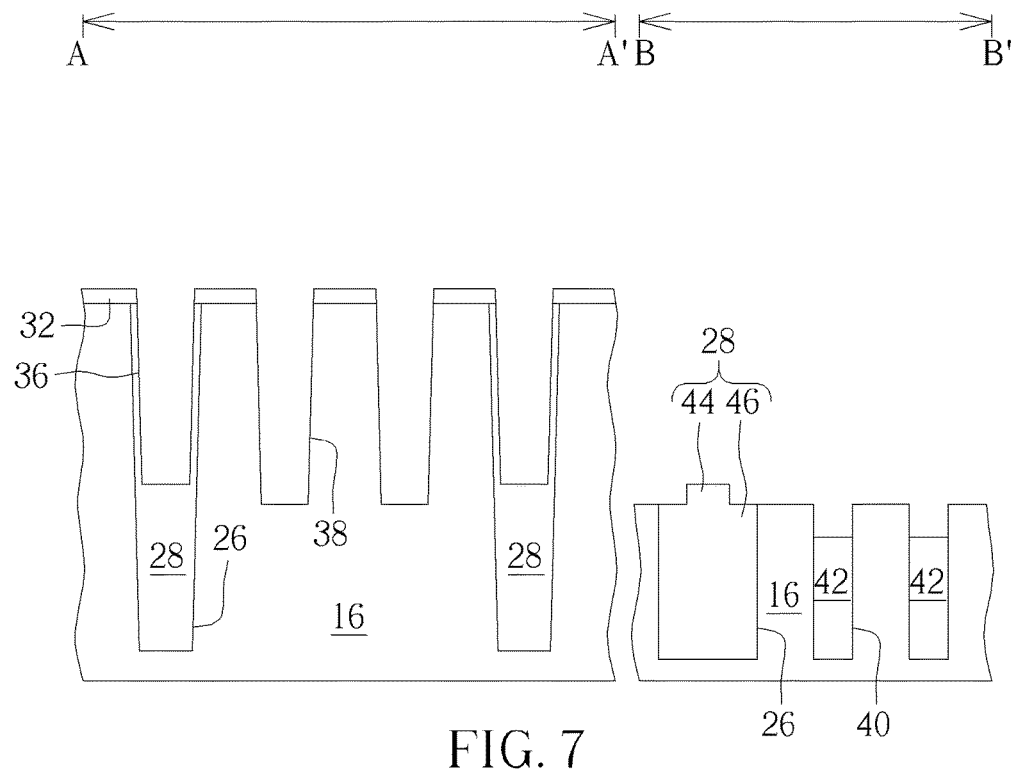

Next, as shown in FIG. 7, an ashing process is conducted to remove the second patterned mask 52 completely and expose the first STI 28.

Figure 8:
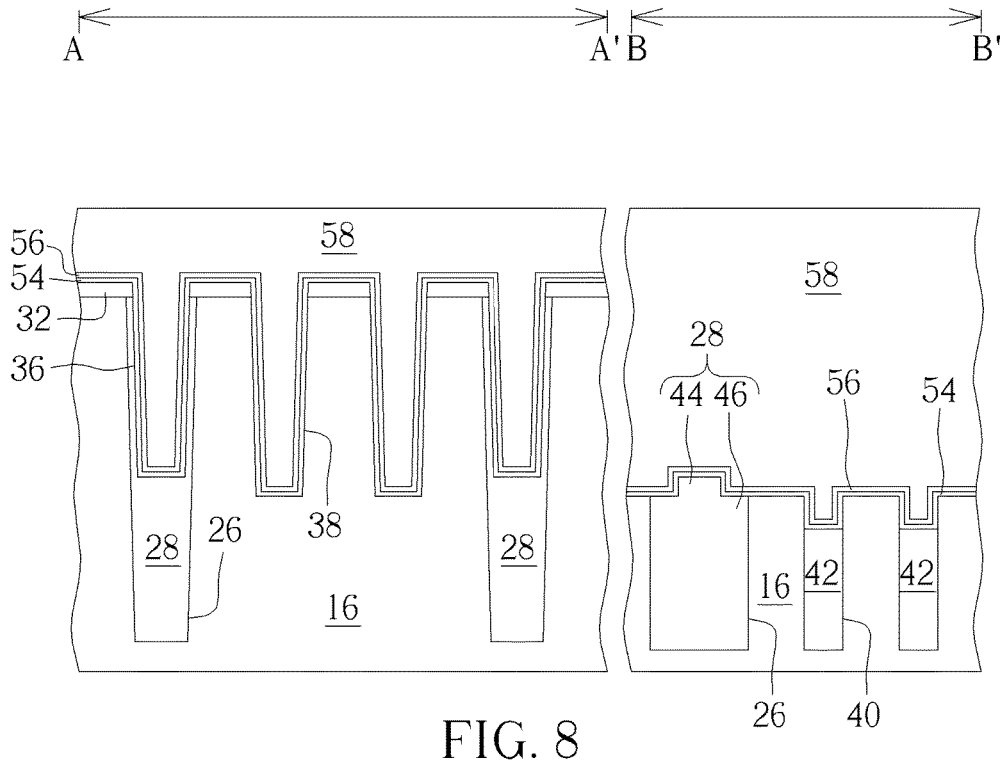

Next, as shown in FIG. 8, a gate dielectric layer 54 and a work function metal layer 56 are formed in the second trenches 36 and third trenches 38, and a conductive layer 58 is formed on the work function metal layer 56. Preferably, the gate dielectric layer 54 includes dielectric material such as silicon oxide, but could also be made of other high-k dielectric material.

In this embodiment, the work function metal layer 56 preferably includes TiN, but could also include n-type work function metal layer and/or p-type work function metal layer depending on the demand of the product. For instance, n-type work function metal layer could include work function metal layer having a work function ranging between 3.9 eV and 4.3 eV such as but not limited to for example titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. P-type work function metal layer on the other hand could include work function metal layer having a work function ranging between 4.8 eV and 5.2 eV such as but not limited to for example titanium nitride (TiN), tantalum nitride (TaN), or tantalum carbide (TaC), but not limited thereto. The conductive layer 58 could be made of low-resistance material including but not limited to for example Cu, Al, W, TiAl, CoWP, or combination thereof.

Figure 9:
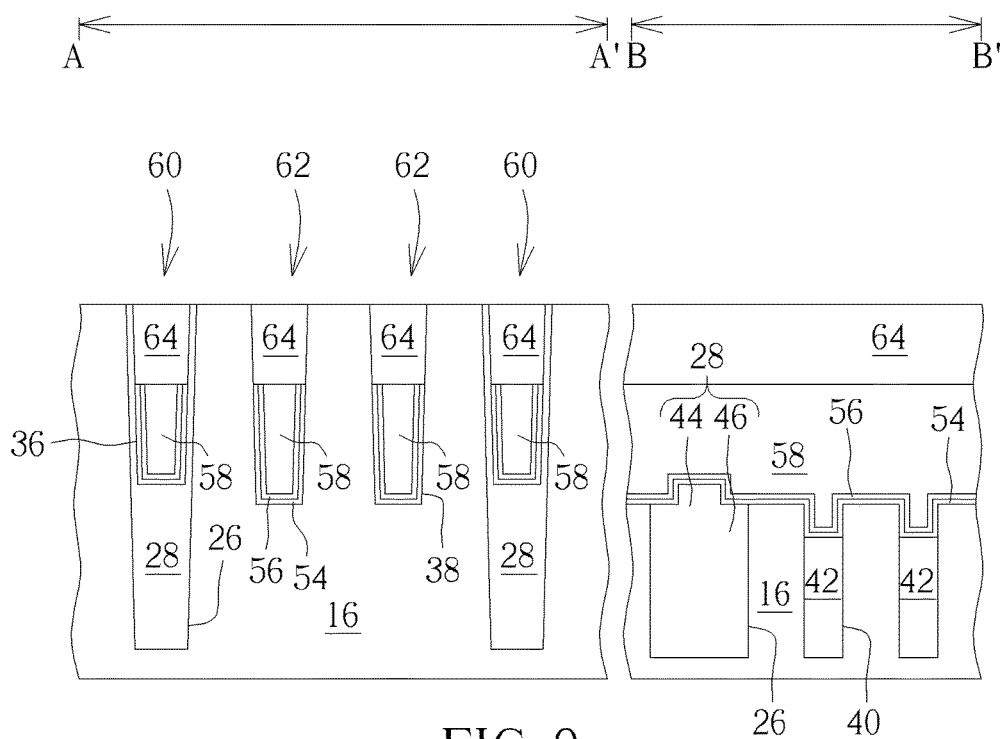

Next, as shown in FIG. 9, a planarizing process and/or an etching back process is conducted to remove part of the conductive layer 58, part of the work function metal layer 56, part of the gate dielectric layer 54, and the remaining dielectric layer 32 so that the top surface of the remaining conductive layer 58, work function metal layer 56, and gate dielectric layer 54 is slightly lower than the top surface of the substrate 16. This forms first gate structures 60 or first gate electrodes in the second trenches 36 and second gate structures 62 or second gate electrodes in the third trenches 38, in which the first gate structures 60 and second gate structures 62 preferably constitute the bit lines 12 shown in FIG. 1. Next, a hard mask 64 is formed on top of each of the first gate structures 60 and second gate structures 62, in which the top surface of the hard mask 64 is even with the top surface of the substrate 16.

Next, an ion implantation process could be conducted depending on the demand of the process to forma doped regions (not shown) such as lightly doped drain or source/drain region in the substrate 16 adjacent to two sides of the first gate structures 60 or second gate structures 62. Next, a contact plug process could be conducted to form word line contacts adjacent to two sides of the second gate structures 62 electrically connecting the source/drain region and bit lines formed thereafter and storage node contacts electrically connecting the source/drain region and capacitors fabricated in the later process.

Referring again to FIG. 9, which further illustrates a structural view of a semiconductor device according to an embodiment of the present invention. As shown in FIG. 9, the semiconductor device preferably includes at least a first gate structure 60 in the substrate 16, at least a second gate structure 62 in the substrate 16 and adjacent to the first gate structure 60, first STI 28 disposed under the first gate structure 60, and second STI 42 disposed adjacent to the first STI 28.

Preferably, a top surface of the first STI 28, or more specifically the top surface of the first STI 28 directly contacting the bottom of the first gate structure 60 is higher than the bottom surface of the second gate structure 62, and the top surface of the second STI 42 is slightly lower than the top surface of the first STI 28. Moreover, the top surface of the first STI 28 is preferably higher than the top surface of the substrate 16 while the top surface of the second STI 42 is lower than the top surface of the substrate 16.

Viewing from a more detailed perspective, the first STI 28 further includes a top portion 44 and a bottom portion 46, in which the width of the top portion 44 is less than the width of the bottom portion 46. Moreover, the top surface of the top portion 44 is higher than the top surface of the substrate 16 while the top portion of the bottom portion 46 is even with the top surface of the substrate 16 and higher than the top surface of the second STI 42.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a first trench and a fourth trench in a substrate;
   forming a first shallow trench isolation (STI) in the first trench and a second STI in the fourth trench;
   forming a first patterned mask on the substrate;
   using the first patterned mask to remove part of the first STI for forming a second trench and remove part of the substrate for forming a third trench, wherein a bottom surface of the third trench is lower than a bottom surface of the second trench;
   forming a second patterned mask on the first STI after forming the second trench and the third trench, wherein the second patterned mask exposes the third trench and the second STI; and
   using the second patterned mask to remove part of the second STI.

2. The method of claim 1, further comprising forming the second STI in the fourth trench while forming the first STI so that the top surfaces of the first STI and the second STI are coplanar.

3. The method of claim 1, further comprising removing part of the second STI so that a top surface of the second STI is lower than a top surface of the first STI.

4. The method of claim 3, wherein a top surface of the first STI is higher than a top surface of the substrate and a top surface of the second STI is lower than a top surface of the substrate.

5. The method of claim 1, further comprising:
   removing the second patterned mask;
   forming a work function metal layer in the second trench and the third trench;
   forming a conductive layer on the work function metal layer;
   removing part of conductive layer and part of the work function metal layer; and
   forming a hard mask in the first second trench and the third trench.

6. The method of claim 1, wherein the first STI comprises a top portion and a bottom portion and a width of the top portion is less than a width of the bottom portion.

7. The method of claim 6, wherein a top surface of the top portion is higher than a top surface of the substrate.

8. The method of claim 6, wherein a top surface of the bottom portion is even with a top surface of the substrate.

9. A semiconductor device, comprising:
   a first gate structure in a substrate;
   a second gate structure in the substrate and adjacent to the first gate structure;
   a first shallow trench isolation (STI) under the first gate structure, wherein a top surface of the first STI is higher than a bottom surface of the second gate structure; and
   a second STI adjacent to the first STI, wherein a top surface of the second STI is lower than a top surface of the first STI.

10. The semiconductor device of claim 9, wherein the STI comprises silicon oxide.

11. The semiconductor device of claim 9, wherein a top surface of the first STI is higher than a top surface of the substrate and a top surface of the second STI is lower than a top surface of the substrate.

12. The semiconductor device of claim 9, wherein the first STI comprises a top portion and a bottom portion and a width of the top portion is less than a width of the bottom portion.

13. The semiconductor device of claim 12, wherein a top surface of the top portion is higher than a top surface of the substrate.

14. The semiconductor device of claim 12, wherein a top surface of the bottom portion is even with a top surface of the substrate.

* * * * *